United States Patent
Ahn et al.

(10) Patent No.: US 9,595,638 B2
(45) Date of Patent: Mar. 14, 2017

(54) LIGHT EMITTING DIODE PACKAGE AND METHOD FOR MANUFACTURING THE SAME

(71) Applicant: PUKYONG NATIONAL UNIVERSITY INDUSTRY-UNIVERSITY COOPERATION FOUNDATION, Busan (KR)

(72) Inventors: Hyung Soo Ahn, Busan (KR); Min Yang, Busan (KR); Kee Sam Shin, Busan (KR); Sam Nyung Yi, Busan (KR); Hyo Jong Lee, Busan (KR); Moon Yeoung Yu, Seoul (KR)

(73) Assignee: PUKYONG NATIONAL UNIVERSITY INDUSTRY-UNIVERSITY COOPERATION FOUNDATION, Nam-Gu, Busan (KR)

( * ) Notice: Subject to any disclaimer, the term of this patent is extended or adjusted under 35 U.S.C. 154(b) by 7 days.

(21) Appl. No.: 14/355,373

(22) PCT Filed: Apr. 26, 2013

(86) PCT No.: PCT/KR2013/003604
§ 371 (c)(1),
(2) Date: Apr. 30, 2014

(87) PCT Pub. No.: WO2013/165124
PCT Pub. Date: Nov. 7, 2013

(65) Prior Publication Data
US 2014/0306248 A1 Oct. 16, 2014

(30) Foreign Application Priority Data
Apr. 30, 2012 (KR) .................. 10-2012-0045620

(51) Int. Cl.
*H01L 29/18* (2006.01)
*H01L 33/36* (2010.01)
(Continued)

(52) U.S. Cl.
CPC .......... *H01L 33/36* (2013.01); *H01L 25/0753* (2013.01); *H01L 33/005* (2013.01);
(Continued)

(58) Field of Classification Search
CPC ................. H01L 33/32; H01L 29/7371; H01L 2924/01079; H01L 29/66272; H01L 33/36;
(Continued)

(56) References Cited

U.S. PATENT DOCUMENTS

2002/0081773 A1* 6/2002 Inoue et al. .................. 438/108
2002/0139987 A1* 10/2002 Collins et al. ................. 257/88
(Continued)

FOREIGN PATENT DOCUMENTS

KR 10-0752719 B1 8/2007
KR 10-2011-0035189 A 4/2011
(Continued)

*Primary Examiner* — Tod T Van Roy
*Assistant Examiner* — Vu A Vu
(74) *Attorney, Agent, or Firm* — Dilworth & Barrese, LLP.; Michael J. Musella (57) ABSTRACT

The present invention relates to a nitride light emitting diode (LED) package, and more specifically, to a nitride light emitting diode package which can improve light-emitting efficiency by increasing light emitting surface area, reduce operating voltage by simultaneously emitting light from six cells at once, and can increase operating current.

13 Claims, 7 Drawing Sheets

(51) Int. Cl.
  *H01L 33/62* (2010.01)
  *H01L 25/075* (2006.01)
  *H01L 33/00* (2010.01)
  *H01L 33/44* (2010.01)

(52) U.S. Cl.
  CPC .............. *H01L 33/62* (2013.01); *H01L 33/44* (2013.01); *H01L 2924/0002* (2013.01); *H01L 2933/0016* (2013.01); *H01L 2933/0033* (2013.01)

(58) Field of Classification Search
  CPC ... H01L 25/0753; H01L 33/005; H01L 33/62; H01L 33/44; H01L 2924/0002; H01L 2933/0016; H01L 2933/0033
  USPC .................................. 257/79–103, 183–201, 257/E33.001–E33.077; 438/25–47, 438/106–140, 309–363
  See application file for complete search history.

(56) References Cited

U.S. PATENT DOCUMENTS

| | | | |
|---|---|---|---|
| 2003/0227020 A1* | 12/2003 | Huang et al. | 257/79 |
| 2004/0245535 A1* | 12/2004 | D'Evelyn et al. | 257/94 |
| 2005/0269588 A1* | 12/2005 | Kim et al. | 257/99 |
| 2006/0192222 A1* | 8/2006 | Chen et al. | 257/99 |
| 2006/0231852 A1* | 10/2006 | Kususe | H01L 24/06 257/99 |
| 2007/0295951 A1* | 12/2007 | Chyi et al. | 257/14 |
| 2008/0087902 A1* | 4/2008 | Lee et al. | 257/88 |
| 2008/0123340 A1* | 5/2008 | McClellan | 362/294 |
| 2009/0159902 A1* | 6/2009 | Yasuda et al. | 257/88 |
| 2009/0283788 A1* | 11/2009 | Shen | 257/99 |
| 2009/0315045 A1* | 12/2009 | Horie | H01L 27/153 257/93 |

FOREIGN PATENT DOCUMENTS

| | | |
|---|---|---|
| KR | 10-2011-0074506 A | 6/2011 |
| KR | 10-2011-0126095 A | 11/2011 |

* cited by examiner

Fig. 1

PRIOR ART

Fig. 12 dry etching mask

Fig. 13

N type pad mask

Fig. 14 pin 54-68 μm    n-p electrode distance 2-16 μm reflective layer and barrier mask

LIGHT EMITTING DIODE PACKAGE AND METHOD FOR MANUFACTURING THE SAME

TECHNICAL FIELD

The present invention is related to manufacturing the Nitride LED Package for flip-chip, one type of Light Emitting Diode (LED) packages. The flip-chip LED package of single chip with 6-LED cells is formed as an embodiment of the invention.

BACKGROUND

Flip-chip packaging was introduced by IBM 30 years ago, and has been used for high-end devices and niche market-oriented up to now.

Flip-chip means not a chip (or cell) or a package type with particular specifications but a method connecting dies to carriers electrically in relation to electrodes. The method using wires for connection is called wire-bond packaging. Flip-chip packaging can be applied to both mesa chip type and vertical chip type.

A die with conductive bumps is flipped and directly connected to a carrier in case of the flip-chip type. Heat generation capacity is thus much bigger than that of wire bond package.

In case of most of electronic devices such as ASIC, microprocessor and SOC (System On Chip), the power consumption for heat generation is about 10-25 W, which is 5-10 W higher than the power consumption which is processed with high temperature wire bond ball grid array (BGA).

On the other hand, flip-chip package power consumption capacity according to heat dissipation design considering heat requirements (maximum junction temperature, ambient temperature and air flow), and package parameters (external cooling structure, package/die size, the number of circuit board layers, the number of balls, etc) is usually 25 W.

Excellent heat dissipation capacity of flip-chip package is due to the structure having heat dissipation parts. In this case, heat is dissipated through thermal balls and internal/external heat dissipation parts. In addition, Flip-chip package need not wire bonding which behaves as a bottle neck of heat; therefore, the package shows good electric performances.

The technology of flip-chip package method as described above has been particularly used to improve the light emitting efficiency of LED in addition. This technology is called as 'leadless semiconductor' because the electrode patterns of a chip on the side to face a circuit board is fused directly with the corresponding patterns of the board without intervened medium such as BGA (ball grid array) or additional connecting structures related metal lead (wire) when semiconductor chips are attached to the board. In addition, the size of the package can be reduced to that of a chip or chips as small as possible; therefore, it is easier to make the package smaller and lighter, resulting in more finite pitch (a distance between electrodes).

Light is usually extracted from a surface of Nitride semiconductors which are generally grown on a substrate of sapphire, insulator. No good thermal conductivity of the sapphire substrate has been regarded as a major problem in heat dissipation. Flip-chip technology was suggested to solve the problem accordingly. The technology is packaging electrodes of cells on PCB (Printed Circuit Board) directly and extracting light from the sapphire substrate. Light transmitting electrodes of Ni/Au are replaced with Rh, the material for ohmic contact with higher reflectivity, to recycle light, resulting in enhancing light extraction efficiency. Nitride semiconductor layers are connected to PCB directly through electrode pads, which structures dissipate heat easily, resulting in improving heat dissipation efficiency.

However, flip-chip packaging suggested new problems to semiconductor manufacturers. Backend processing companies which are specialized in the flip-chip packaging technology of packaging, assembly, and test service are in need.

Figure 1:
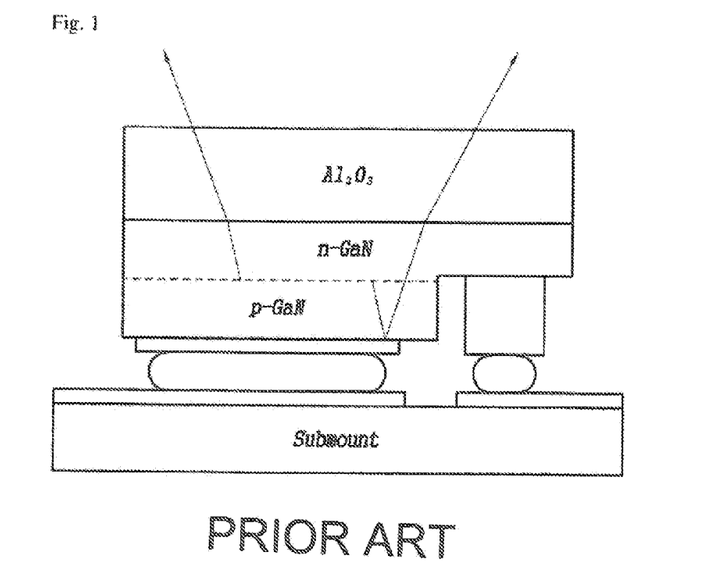
FIG. 1 shows a flip chip LED structure.

The typical structure of flip-chip packaging extracts light not from top of the device but from sapphire substrate as shown in FIG. 1.

Refractive index of GaN and air is 2.4 and 1 respectively. The noticeable difference between the refractive indexes results in particularly small critical angle of 23°. The small amount of light due to the critical angle can only be extracted to air and the rest of light is captured within LED structure inside by internal total reflection. In addition, top-emission type LED emits light through p type GaN epi layer and hence absorption loss take places by the metal of p type transparent electrodes and p type pad electrodes, resulting in further decreased light emitting efficiency too.

However, in the case of flip-chip LED of mesa type, light paths are formed via not to p metal but to sapphire substrate by shaping reflective layer with the metal of high reflective index such as Ag. As a result, most of light is sufficiently extracted through the thin sapphire substrate processed with lapping and polishing processes. Reflective index difference between 1 of air and 1.76 of a sapphire substrate with good transmittance decreases and the critical angle is larger than the critical angle of GaN epi to air. This means that total internal reflection decreases.

In addition, light absorption loss by p type metal electrodes can be also decreased and hence light extraction efficiency is expected to increase also. This type package also shows excellent heat dissipation performance in comparison with wire bond package in general use; therefore, this type technology is more adaptive to embody high power devices. Besides, the package size can be minimized proportional to chip size, resulting in smaller and lighter devices.

DETAILED DESCRIPTION

Technical Object

The present invention is related to LED (Light Emitting Diode) package. The nitride LED package for flip-chip as an embodiment of the invention enhances the light emitting efficiency and decrease working voltage and increase working current of 6 cells as a whole while the 6 cells (vertical chip) lights simultaneously.

Means to Achieve the Object

According to one aspect, an embodiment of light emitting diode package includes:
a substrate;
a plurality of LED cells formed on the substrate;
two or more groups consisting of two or more LED cells;
p electrodes formed on top of the LED cells;
insulation layer exposing underlying n layer by etching a part of area around a chip to form trench;
n contact electrode formed on n type nitride semiconductor layer which is elongated from the n layer of the LED cells and exposed by trench; and two n type contact electrodes which are elongated respectively from p type electrodes of two groups and formed on insulation layer which is formed on the n type semiconductor.

Figure 2:
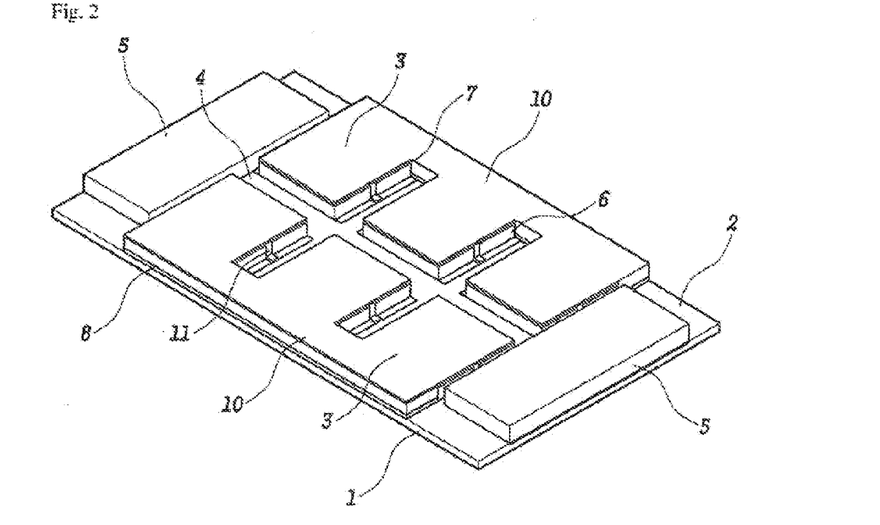
FIG. 2 shows a structure of light emitting diode package as a preferred embodiment of the present invention.

As another embodiment of this invention, the number of cells can be 6 or more. FIG. 2 related to the embodiment shows the form of two groups, consisting of 3 cells respectively, facing each other. The number of cells belonging to each group can be 3 or more.

As the third embodiment of this invention, the cells can be placed symmetrically or asymmetrically. FIG. 2 related to the embodiment shows the symmetric form of two groups, consisting of 3 cells respectively; however, it is not necessary for the groups to face each other symmetrically in cell arrangement. It is also possible to be asymmetric arrangement including straight line or circular configuration.

As the forth embodiment of this invention, the lower direction (or face) of the substrate can be placed on a heat dissipation device. A structure of the heat dissipation device is not limited to particular requirements if the device works properly as a heat sink. That is, a variety of heat exchangers or heat dissipation devices such as not only a typical pin-fin style structure but also s heat pipe type construction can be applied without limit.

As the fifth embodiment of this invention, one or single voltage can be applied to drive cells. Applying single driving voltage means that the same driving voltage can be applied to a plurality of cells as a whole.

As the sixth embodiment of this invention, when single voltage is applied to drive a plurality of cells, current can be applied to each cell respectively. Each cell is arranged in parallel and current runs respectively for each cell.

As the seventh embodiment of this invention, current path is further included on a part of each cell.

As a result, over current and electrostatic current can flows along the paths described as 11 of FIG. 2. In relation, Korean Patent Application 10-2010-0054102 needs to be referred.

According to another aspect of the present invention, an embodiment of method of making a light emitting diode package includes:
preparing a substrate;
forming a plurality of semiconductor layers including n-layer, active, p-layer on the substrate;
forming a plurality of LED cells by etching the plurality of semiconductor layers with exposing n-layer;
forming p-electrodes on the top of the plurality of cells;
forming insulation layer in the area which is the rest of the substrate surface that the cells occupy;
forming trench by etching a part of the insulation layer;
forming n type electrode pads on the n layer exposed with the trench;
forming reflector on top of the plurality of cells; and
forming p type electrode pads on the top of the cells and a part of the insulation layer.

Effect of the Invention

The present invention includes the embodiment of 6 cell structure formed on n type semiconductor layer on a substrate; n type electrode comprising n type pad electrode and n type contact electrode elongated from the n type pad electrode and exposed with trench; and p type electrodes formed on p type nitride semiconductor layer and p type pad electrode, which is elongated from the p type electrodes and formed on the insulation layer on n type semiconductor. The 6 cells emit light simultaneously and light emission area is increased with flip chip construction.

According to the invention, therefore, it is possible to enhance the light emitting efficiency of flip chip nitride LED, to decrease working current of each cell, and to improve reliability of the devices.

DETAILED DESCRIPTION OF PREFERRED EMBODIMENTS

With reference to attached drawings, the present invention is explained with preferred embodiments in detail.

In case of LED, flip chip package is primarily applied to mesa type chips in which both of two electrodes are placed one side of stacked semiconductor structure. A vertical type flip chip package of this invention has p and n electrodes placed on the opposite side of stacked semiconductor layers and any electrode disposed apart from the substrate is connected down to the substrate level by the photolithography of a metal layer.

The structure of this invention is shown in FIG. 2. A nitride semiconductor LED package for flip chip as an embodiment of this invention includes:
the structure (3) of 6 LED cells formed on the n type semiconductor layer (2) on a sapphire substrate (1);
n type pad electrode;
n type electrode including n type contact electrode (5) which is elongated from the n type pad electrode (4) and contacts a part of n type nitride semiconductor layer which exposed with trench;
p type electrodes (7) formed on the p type nitride semiconductor (6);
P contact electrode (10) which is elongated from the p type electrode and formed on the insulation layer (8) which is formed on the n type semiconductor layer FIGS. 3 to 11 is schematics of the method of making light emitting diode package as a preferred embodiment of the present invention.

Figure 3:
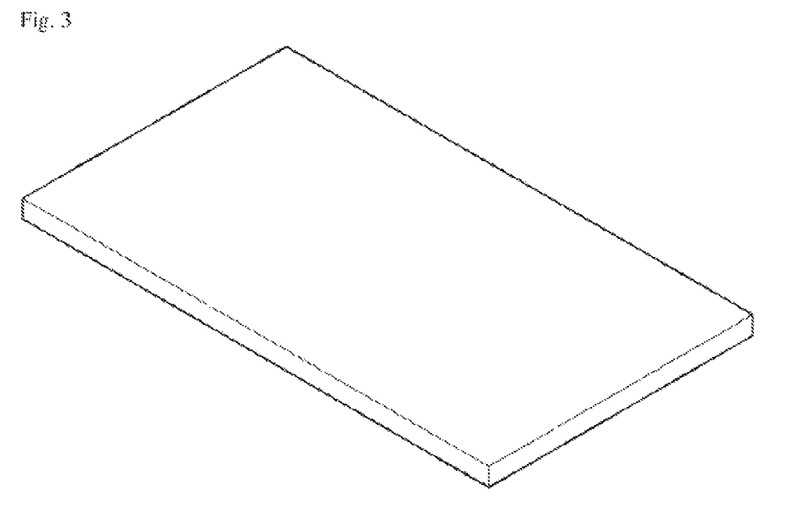
FIGS. 3 to 11 shows a method of making light emitting diode package as a preferred embodiment of the present invention.

FIG. 3 shows the preparing stage of LED structure including DH structure formed on a sapphire substrate.

Figure 4:
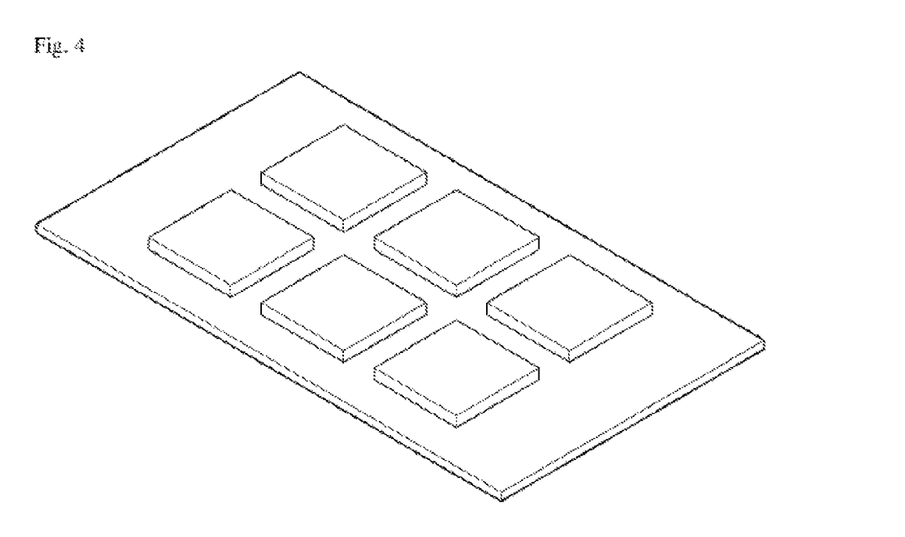

FIG. 4 shows 6 cells formed by etching down to n type semiconductor layer with usual etching method (dry etching).

Figure 5:
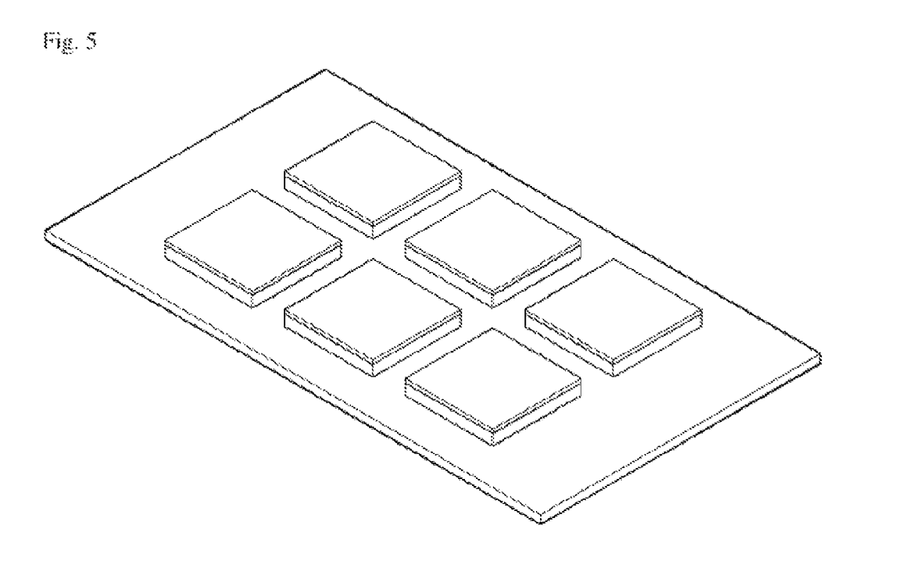

FIG. 5 shows p electrodes formed on the top of the 6 cells. The p electrode is made of ITO or Cr/Ni/Au etc.

Figure 6:
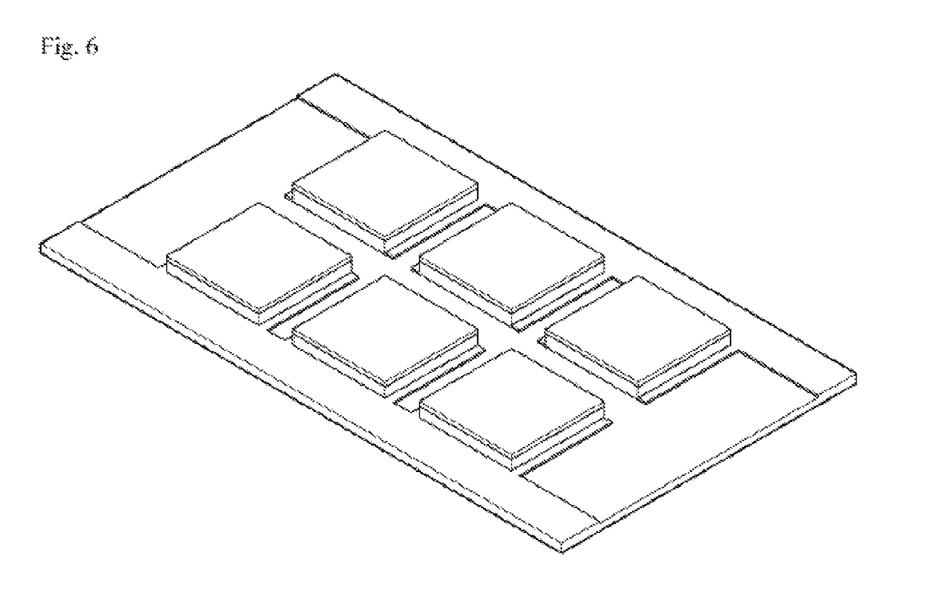

FIG. 6 shows a window which is opened after forming $SiO_2$ layer. The n type electrode is formed on the n type semiconductor layer except the area which the 6 cells occupy. The n type electrode can be made of metals such as Cr/Ni/Au.

Figure 7:
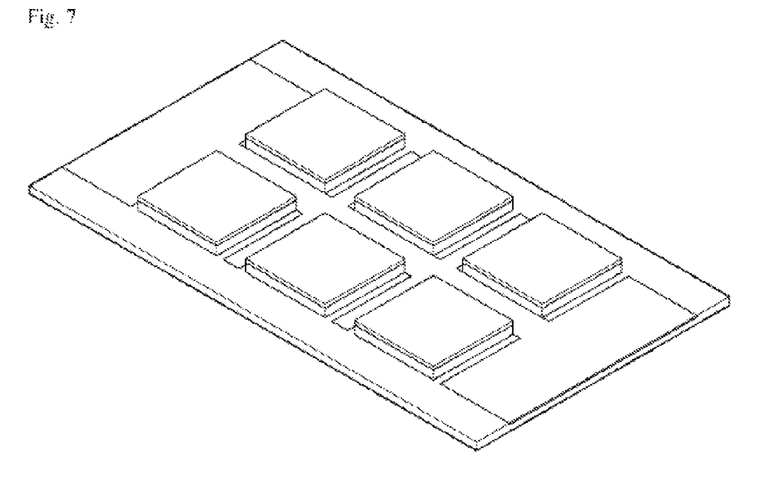

FIG. 7 shows n type electrode pad formed on n type electrode again.

In this case, the pad electrode can be made of Cr/Ni/Au (Chromium/Nickel/Gold) etc.

Figure 8:
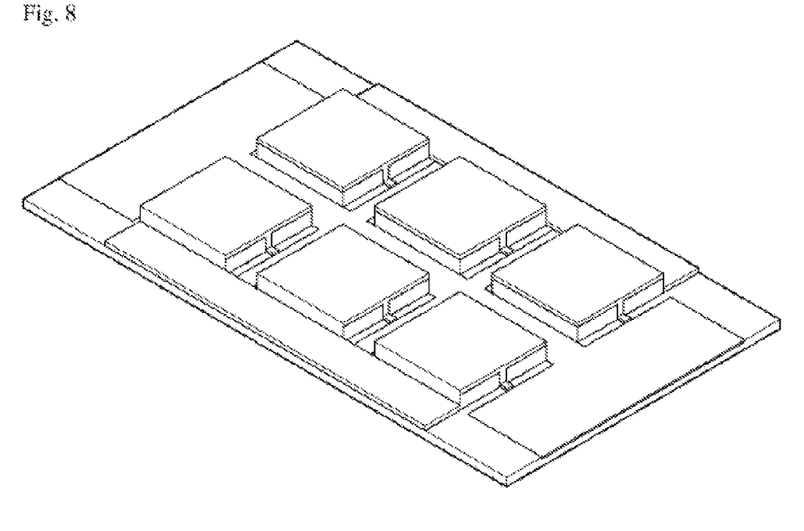

FIG. 8 shows that reflector, which can be made of Ag (silver), is formed on the top of the 6 cells and barrier electrode, which can be made of Ti/Ni/Au (Titanium/Nickel/Gold), is formed.

Figure 9:
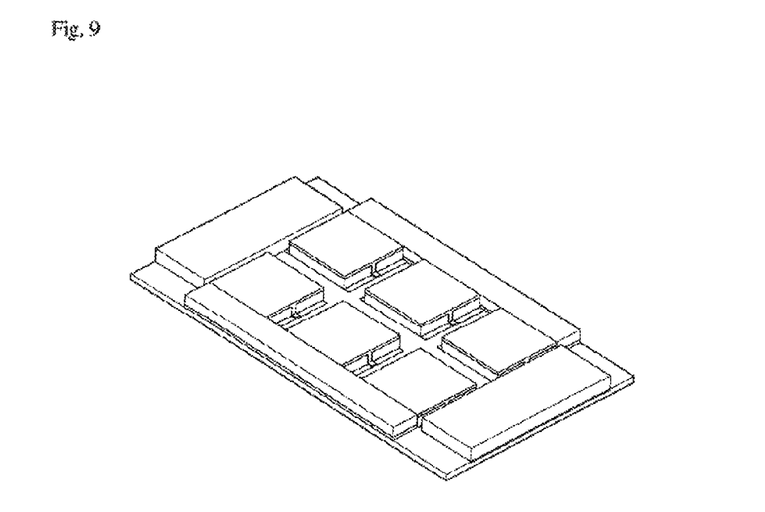

FIG. 9 show the first solder formed on the n type pad electrode and p type pad electrode. In this case, solder material is Sn or Sn+Au. Current paths are formed at this time.

Figure 10:
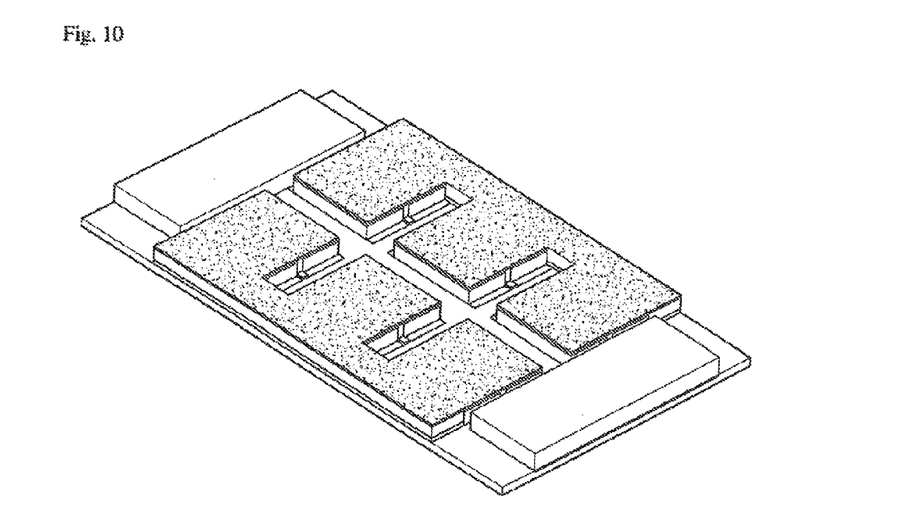

FIG. 10 shows that the second solder (Sn) is formed on the p type electrode and the p type pad.

Figure 11:
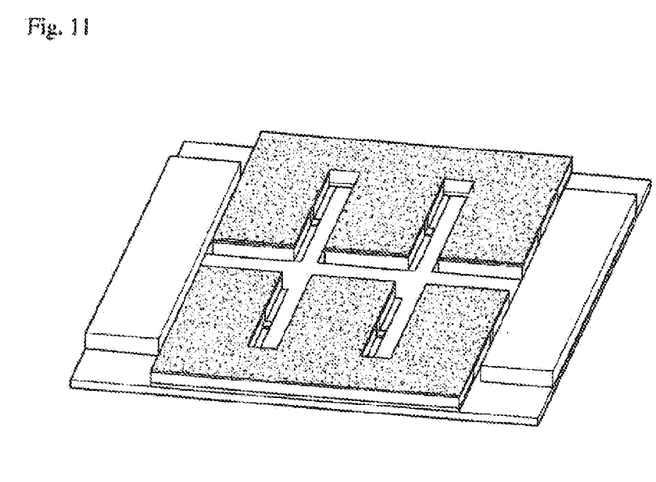
Figure 12:
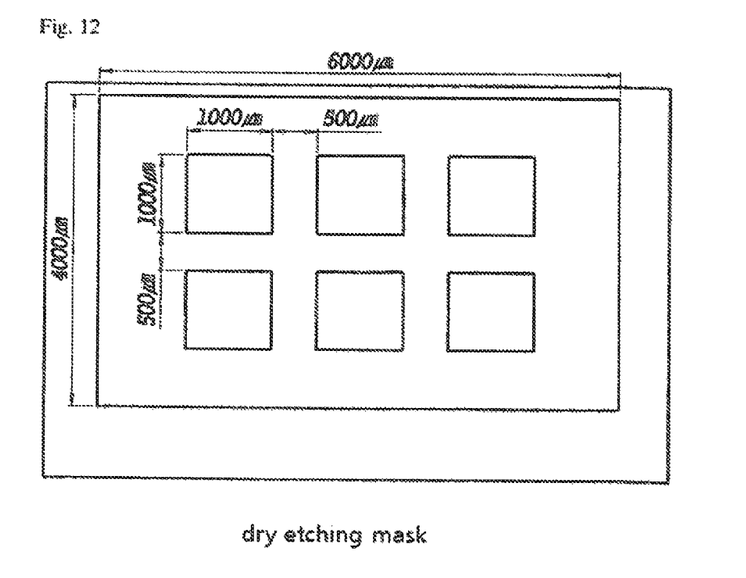
FIG. 12 shows a mask design as a sample of chip arrangement and module dimensions of a preferred embodiment of the present invention.

FIG. 11 shows the finished 6 cell flip chip. The thickness of the sapphire substrate is about 100~250 um and the size of the 6 LED cells respectively is 1 mm×1 mm. FIG. 12 is a mask design as an example to illustrate the chip arrangement and module size of a preferred embodiment of the present invention.

Figure 13:
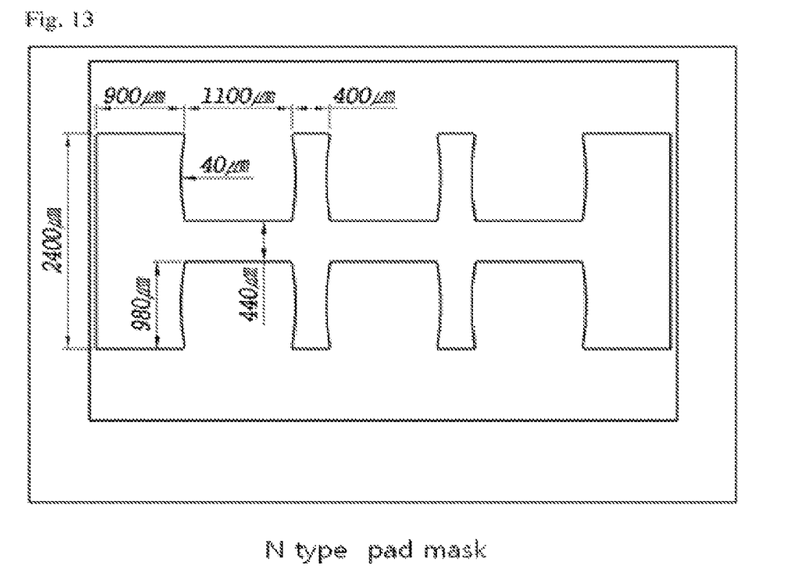
FIG. 13 shows a mask design to place n pad electrode of a preferred embodiment.

FIG. 13 shows a mask design to place the n pad electrode of a preferred embodiment of the present invention.

Figure 14:
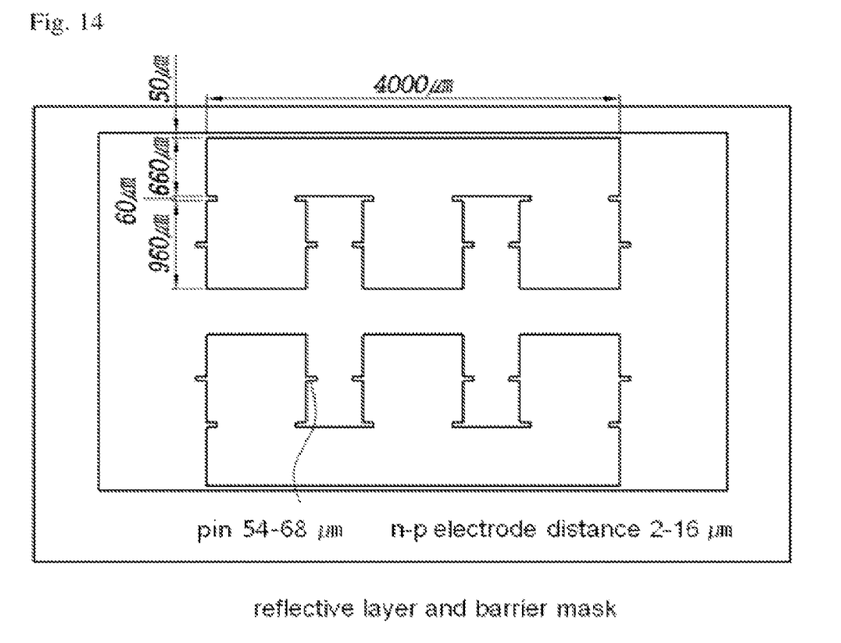
FIG. 14 shows a mask design to place reflector and barrier of a preferred embodiment.

FIG. 14 shows a mask design as a sample to place the reflector and barrier of a preferred embodiment of the present invention. As shown in FIG. 2, the n pad electrode (4) of the package finished with these masks acts for the 6 cells (3) in common. The 6 cells work with the voltage applied simultaneously to the n contact electrode of metal pads on both sides. The p type electrodes (4) are separated because of the 6 LED cell structure (3) and thus current flows independently; however, the pad metal is divided into two parts and hence 3 cells work together through the p contact electrode (10).

Single voltage is therefore applied constantly to 6 cells and current is applied separately to each cell, thereby resulting in single voltage and maximum current.

In addition, 3 cells form a group. Even if one cell is out of order during lighting, the group still works to emit light and the reliability of the device as a whole can be improved accordingly.

The embodiments of this invention in the detailed description and the structures expressed in the drawings of the specifications are just preferred embodiments and do not include all of technical ideas which the invention contains.

The scope of this invention described with reference to the preferred embodiments does not limited to the embodiments themselves. Modifications and alterations will obviously occur to a person having ordinary skill in the art upon reading and understanding the preceding detailed description. It is intended that the invention be construed as including all such modifications and alterations insofar as they come within the scope of the appended claims or the equivalents thereof.

We claim:

1. A light emitting diode (LED) package, comprising;
a substrate;
an n type semiconductor layer formed over the substrate;
a plurality of LED cells formed over the substrate, each LED cell comprising an n type semiconductor layer being a part of the n type semiconductor layer formed over the substrate, an active layer formed over the part of the n type semiconductor layer, and a p type semiconductor layer formed over the active layer, the plurality of LED cells comprising at least two separate groups of LED cells, each separate group including two or more LED cells;
a p type electrode formed over each LED cell;
an insulation layer formed over the n type semiconductor layer surrounding the plurality of LED cells, the insulation layer including a trench that exposes part of the underlying n type semiconductor layer in a part of an area around the LED cells;
one n type pad electrode which is connected to and extends from the n type semiconductor layer of the LED cells and is formed on the n type semiconductor layer exposed by the trench, the n type pad electrode forming one common n type electrode layer for all the LED cells; and
a p type contact electrode for each separate group of LED cells each of which is connected to and extends from each of the p type electrodes of a respective separate group of LED cells and are formed over the insulation layer.

2. The light emitting diode package according to claim 1, comprising 6 or more of the LED cells.

3. The light emitting diode package according to claim 1, wherein the LED cells are placed symmetrically.

4. The light emitting diode package according to claim 1, additionally comprising a heat dissipation device on which a lower side of the substrate is placed.

5. The light emitting diode package according to claim 1, additionally comprising means for applying a single voltage input to drive the LED cells.

6. The light emitting diode package according to claim 1, additionally comprising means for applying a single voltage input to drive the two or more LED cells and direct current to flow respectively through each LED cell.

7. The light emitting diode package according to claim 1, further comprising a current path on a part of each LED cell, wherein overcurrent and static electricity flows along the current path.

8. A method for making a light emitting diode (LED) package, comprising the steps of:
preparing a substrate;
forming a plurality of semiconductor layers including an n type semiconductor layer, an active layer, and a p type semiconductor layer over the substrate;
exposing the n-layer by etching the semiconductor layers to form a plurality of LED cells, each LED cell comprising an n type semiconductor layer being a part of the n type semiconductor layer formed over the substrate, an active layer being a part of the active layer formed over the substrate, and a p type semiconductor layer being a part of the p type semiconductor layer formed over the substrate, the plurality of LED cells comprising at least two separate groups of LED cells, each separate group including two or more LED cells;
forming a p type electrode over each LED cell;
forming an insulation layer over the substrate surface except for areas which the LED cells occupy;
forming a trench by etching a part of the insulation layer to expose part of the n type semiconductor layer in a part of an area around the LED cells;
forming a single n type pad electrode over the part of the n type semiconductor layer exposed by the trench, the n type pad electrode being connected to and extending away from the n type semiconductor layers of all of the plurality of LED cells;
forming a reflector over the top of each LED cell; and
forming a p type contact electrode for each of the at least two separate groups of LED cells, each p type contact electrode being formed over the top of each LED cell of a respective separate group of LED cells and over a part of the insulation layer, thereby forming the at least two separate groups of LED cells connected in parallel with respect to one another.

9. The light emitting diode package according to claim 2, comprising two groups of LED cells in parallel, each said group having three LED cells.

10. The light emitting diode package according to claim 1, comprising a vertical arrangement from bottom to top of the substrate,
   the n-type semiconductor layer on top of the substrate,
   the insulation layer on top of the n-type semiconductor layer, and
   the p-type electrode components on top of the insulation layer,
   with a p-type electrode layer situated on top of and interconnecting the LED cells of each separate group of LED cells.

11. The light emitting diode package according to claim 10, having two said n type contact electrodes, each formed as a pad situated upon and extending upwardly from the underlying n layer at opposite edges of the diode package from one another facing through the trench and extending upwardly laterally and in parallel to each LED cell.

12. The light emitting diode according to claim 11, wherein said separate groups of LED cells are situated along edges of the diode package between the n type pad electrode.

13. The light emitting diode according to claim 12, comprising two separate groups of LED cells each having three LED cells and in the shape of an E facing one another when viewed from above.

* * * * *